United States Patent
Ebe et al.

(10) Patent No.: US 9,246,063 B2
(45) Date of Patent: Jan. 26, 2016

(54) PHOSPHOR ENCAPSULATING SHEET, LIGHT EMITTING DIODE DEVICE, AND PRODUCING METHOD THEREOF

(71) Applicant: NITTO DENKO CORPORATION, Ibaraki-shi, Osaka (JP)

(72) Inventors: Yuki Ebe, Osaka (JP); Yasunari Ooyabu, Osaka (JP); Hiroshi Noro, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 69 days.

(21) Appl. No.: 13/785,916

(22) Filed: Mar. 5, 2013

(65) Prior Publication Data
US 2013/0234187 A1  Sep. 12, 2013

(30) Foreign Application Priority Data

Mar. 6, 2012  (JP) ................. 2012-049007
Jan. 11, 2013  (JP) ................. 2013-003080

(51) Int. Cl.
*H01L 33/50* (2010.01)
*H01L 33/56* (2010.01)
*B32B 27/08* (2006.01)

(52) U.S. Cl.
CPC ............. *H01L 33/50* (2013.01); *B32B 27/08* (2013.01); *H01L 33/56* (2013.01); *H01L 2924/0002* (2013.01); *H01L 2933/005* (2013.01); *Y10T 428/2848* (2015.01)

(58) Field of Classification Search
USPC .......... 257/81, 82, 91, 98, 99, 100, 116, 117, 257/432–437, 749, E33.056–E33.059, 257/E25.032
See application file for complete search history.

(56) References Cited

U.S. PATENT DOCUMENTS

| | | | |
|---|---|---|---|
| 2005/0054776 A1* | 3/2005 | Itou et al. | 525/191 |
| 2007/0004065 A1* | 1/2007 | Schardt et al. | 438/26 |
| 2008/0048200 A1* | 2/2008 | Mueller et al. | 257/98 |
| 2009/0160043 A1* | 6/2009 | Shen et al. | 257/690 |
| 2009/0160071 A1* | 6/2009 | Shen | 257/786 |
| 2010/0327733 A1 | 12/2010 | Shaikevitch | |
| 2010/0328923 A1 | 12/2010 | Shaikevitch | |
| 2011/0024786 A1* | 2/2011 | Sugiyama | 257/99 |
| 2011/0309398 A1 | 12/2011 | Ito et al. | |
| 2011/0316032 A1 | 12/2011 | Ooyabu et al. | |
| 2012/0052608 A1* | 3/2012 | Yoo et al. | 438/27 |

FOREIGN PATENT DOCUMENTS

| | | |
|---|---|---|
| JP | 2005-093681 A | 4/2005 |
| JP | 2009-094262 A | 4/2009 |
| WO | 2011/140353 A2 | 11/2011 |

OTHER PUBLICATIONS

European Search Report issued in corresponding EP Application No. 13157798.3, dated Jul. 11, 2013.

* cited by examiner

*Primary Examiner* — David Vu
*Assistant Examiner* — Jonathan Han
(74) *Attorney, Agent, or Firm* — Sughrue Mion, PLLC

(57) ABSTRACT

A phosphor encapsulating sheet, for encapsulating a light emitting diode element, includes a phosphor layer, an encapsulating layer formed at one side in a thickness direction of the phosphor layer, and an adhesive layer formed at the other side in the thickness direction of the phosphor layer for being adhered to a cover layer.

6 Claims, 5 Drawing Sheets

1

FIG. 3
FIG. 3(a)
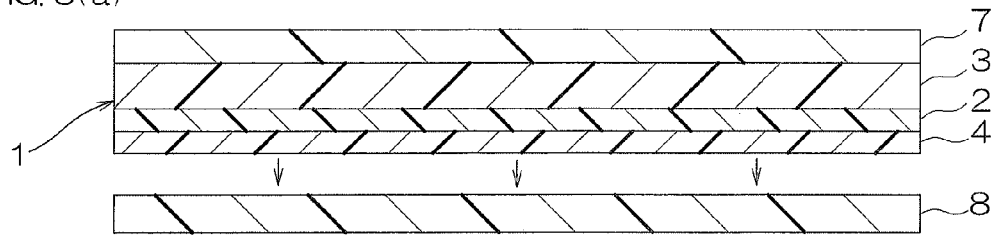
FIG. 3(b)
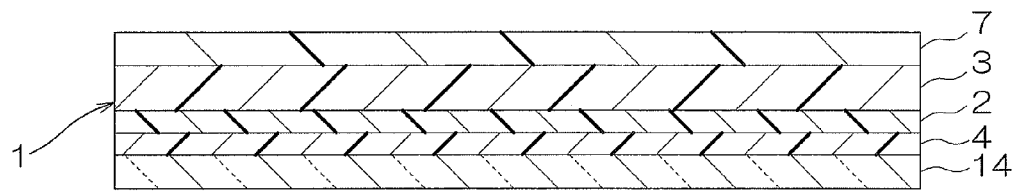
FIG. 3(c)
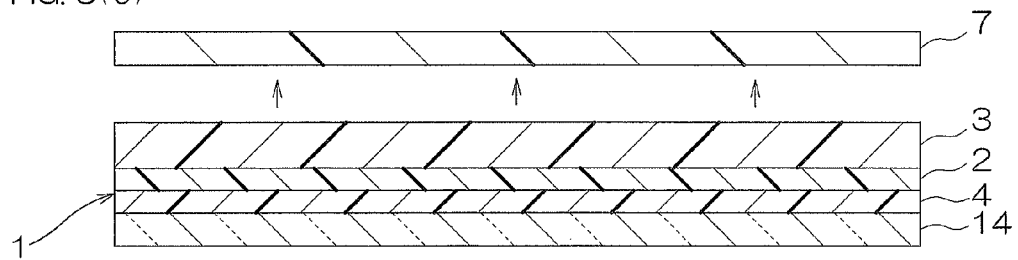
FIG. 3(d)
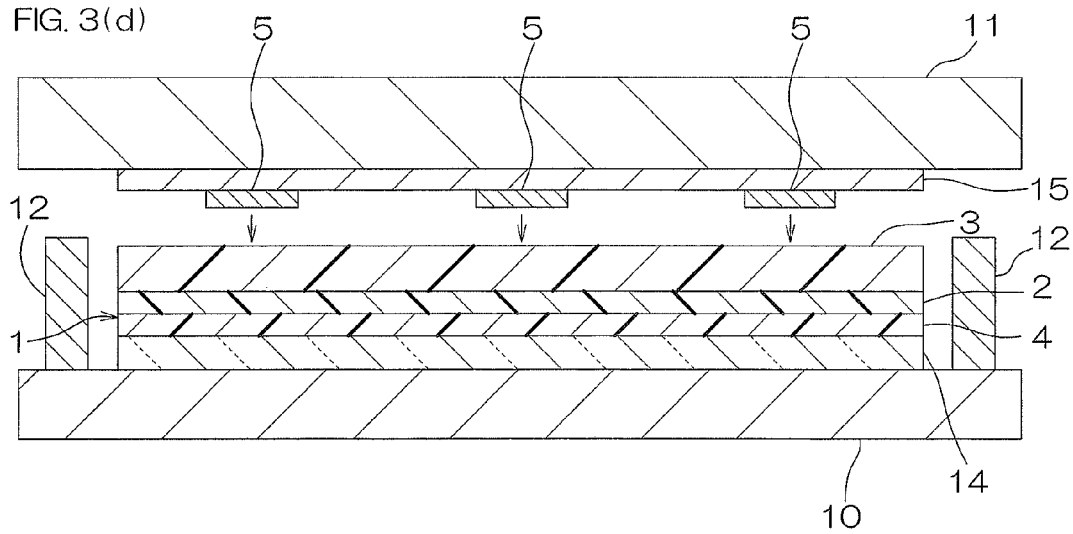

FIG. 4
FIG. 4(e)
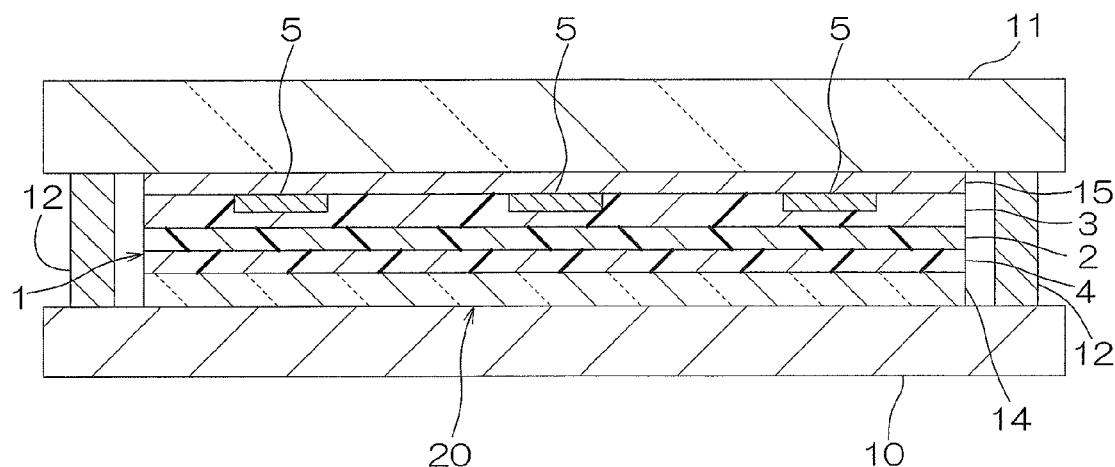
FIG. 4(f)
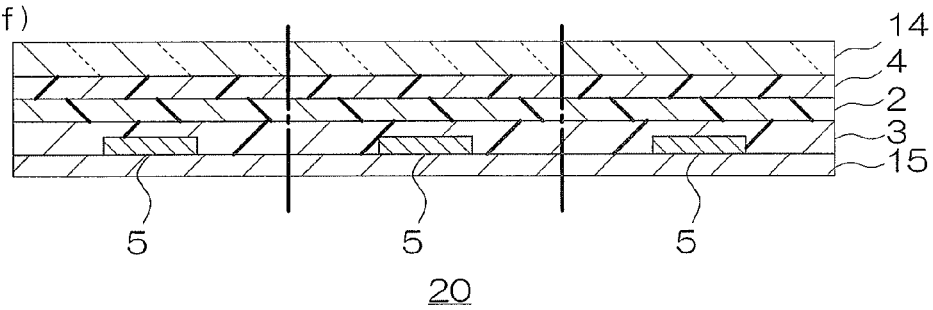
FIG. 4(g)
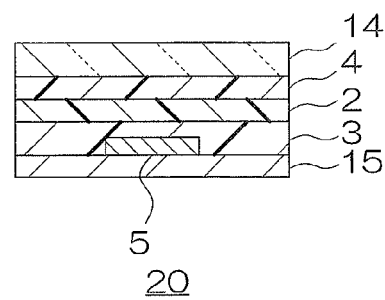

PHOSPHOR ENCAPSULATING SHEET, LIGHT EMITTING DIODE DEVICE, AND PRODUCING METHOD THEREOF

CROSS-REFERENCE TO RELATED APPLICATION

The present application claims priority from Japanese Patent Applications No. 2012-049007 filed on Mar. 6, 2012 and No. 2013-3080 filed on Jan. 11, 2013, the contents of which are hereby incorporated by reference into this application.

BACKGROUND OF THE INVENTION

1. Field of the Invention

The present invention relates to a phosphor encapsulating sheet, a light emitting diode device, and a producing method thereof, to be specific, to a phosphor encapsulating sheet, a method for producing a light emitting diode device using the phosphor encapsulating sheet, and a light emitting diode device obtained by the method.

2. Description of Related Art

A light emitting diode device is provided with, for example, a board, an LED (a light emitting diode element) which is mounted on the upper surface of the board and emits blue light, a phosphor layer which is capable of converting the blue light into yellow light and is provided on the LED, and a lens layer (a cover layer) which is laminated on the upper surface of the phosphor layer. The light emitting diode device emits high-energy white light via the lens layer by color mixing of the blue light, which is emitted from the LED to which electric power is supplied from the board and transmits through the phosphor layer, and the yellow light, which is converted in wavelength from a part of the blue light in the phosphor layer.

As such a light emitting diode device, for example, a light emitting device which is provided with a substrate on which a reflecting frame is provided on the upper surface thereof, an LED element that is mounted on the bottom surface (the upper surface of the substrate) of a concave portion surrounded by the reflecting frame, a mold resin that fills the inside of the concave portion and encapsulates the LED element, a wavelength converting material layer that is laminated on the mold resin, and a light transmissive sheet board that is formed on the wavelength converting material layer has been proposed (ref: for example, Japanese Unexamined Patent Publication No. 2005-93681 described below).

In order to obtain the light emitting device in Japanese Unexamined Patent Publication No. 2005-93681, first, the substrate on which the LED element is mounted is prepared. Next, the mold rein is allowed to fill the inside of the concave portion, subsequently, the wavelength converting material layer is laminated on the mold resin, and thereafter, the light transmissive sheet board is laminated thereon.

SUMMARY OF THE INVENTION

However, in the producing method in Japanese Unexamined Patent Publication No. 2005-93681, it is required that the mold resin, the wavelength converting material layer, and the light transmissive sheet board are sequentially formed on the LED element.

Therefore, there is a disadvantage that the number of the production steps is increased and the operation becomes complicated, so that the production cost is increased.

It is an object of the present invention to provide a phosphor encapsulating sheet in which a phosphor layer is adhered to a cover layer by an adhesive layer to easily achieve the improvement of the mechanical strength and a light emitting diode element is capable of being easily encapsulated by an encapsulating layer, while the phosphor layer is capable of being opposed to the light emitting diode element; a method for producing a light emitting diode device using the phosphor encapsulating sheet; and a light emitting diode device obtained by the method.

A phosphor encapsulating sheet of the present invention, for encapsulating a light emitting diode element, includes a phosphor layer, an encapsulating layer formed at one side in a thickness direction of the phosphor layer, and an adhesive layer formed at the other side in the thickness direction of the phosphor layer for being adhered to a cover layer.

In the phosphor encapsulating sheet of the present invention, it is preferable that the phosphor encapsulating sheet is obtained by laminating the phosphor layer and the encapsulating layer having a storage shear modulus G' at a frequency of 1 Hz at 25° C. satisfying the following formula (A):

(The storage shear modulus G' of the phosphor layer)/
(The storage shear modulus G' of the encapsulating layer)≥20     (A)

In the phosphor encapsulating sheet of the present invention, it is preferable that the phosphor encapsulating sheet is obtained by laminating the phosphor layer and the encapsulating layer having a storage shear modulus G' at a frequency of 1 Hz at 25° C. satisfying the following formula (B):

(The storage shear modulus G' of the phosphor layer)/
(The storage shear modulus G' of the encapsulating layer)<20     (B)

In the phosphor encapsulating sheet of the present invention, it is preferable that the encapsulating layer and the adhesive layer contain a silicone resin.

In the phosphor encapsulating sheet of the present invention, it is preferable that the silicone resin is in a B-stage state.

In the phosphor encapsulating sheet of the present invention, it is preferable that the phosphor layer is formed of at least one selected from the group consisting of a silicone resin in a B-stage state, a silicone resin in a C-stage state, and a ceramic plate.

A method for producing a light emitting diode device of the present invention includes the steps of preparing a board on which a light emitting diode element is mounted; attaching a phosphor layer to a cover layer via an adhesive layer in a phosphor encapsulating sheet including the phosphor layer, an encapsulating layer formed at one side in a thickness direction of the phosphor layer, and the adhesive layer formed at the other side in the thickness direction of the phosphor layer (a first attaching step); and attaching the encapsulating layer to the board so as to cover the light emitting diode element (a second attaching step).

In the method for producing a light emitting diode device of the present invention, it is preferable that the encapsulating layer and the adhesive layer contain a silicone resin in a B-stage state; of the first attaching step and the second attaching step, one step is first performed and then, the other step is performed, or, both of the steps are performed at the same time; and in the step of performing the other step or the step of performing both of the steps, the silicone resins in the encapsulating layer and the adhesive layer are brought into a C-stage state by heating.

A light emitting diode device of the present invention is produced by a method for producing a light emitting diode device including the steps of preparing a board on which a light emitting diode element is mounted; attaching a phosphor layer to a cover layer via an adhesive layer in a phosphor encapsulating sheet including the phosphor layer, an encapsulating layer formed at one side in a thickness direction of the phosphor layer, and the adhesive layer formed at the other side in the thickness direction of the phosphor layer (a first attaching step); and attaching the encapsulating layer to the board so as to cover the light emitting diode element (a second attaching step).

In the light emitting diode device of the present invention, it is preferable that the phosphor layer is formed into a flat plate shape along the direction perpendicular to the thickness direction.

In the light emitting diode device of the present invention, it is preferable that the phosphor layer is formed corresponding to the shape of the light emitting diode element.

According to the phosphor encapsulating sheet of the present invention, the phosphor layer is adhered to the cover layer via the adhesive layer and the light emitting diode element can be encapsulated by the encapsulating layer.

Additionally, in the phosphor encapsulating sheet of the present invention, the encapsulating layer and the adhesive layer are provided on both surfaces in the thickness direction of the phosphor layer in advance. Therefore, according to the method for producing a light emitting diode device of the present invention, the phosphor layer is attached to the cover layer via the adhesive layer and the encapsulating layer is attached to the board so as to cover the light emitting diode element, so that the light emitting diode element can be easily encapsulated by the encapsulating layer, while the phosphor layer is adhered to the cover layer by the adhesive layer.

Therefore, the light emitting diode device of the present invention in which the light emitting diode element is encapsulated by the phosphor encapsulating sheet can emit high-energy light by improving the reliability by the encapsulating layer and converting light emitted from the light emitting diode element by the phosphor layer, and furthermore, can emit the light via the cover layer.

BRIEF DESCRIPTION OF THE DRAWINGS

FIG. 3 shows process drawings for illustrating a method for producing one embodiment of a light emitting diode device of the present invention using the phosphor encapsulating sheet shown in FIG. 1:

FIG. 3 (a) illustrating a step of peeling a second substrate from an adhesive layer, FIG. 3 (b) illustrating a step of attaching a cover layer to the adhesive layer, FIG. 3 (c) illustrating a step of peeling a first substrate from an encapsulating layer, and FIG. 3 (d) illustrating a step of setting a board and the phosphor encapsulating sheet in a pressing machine.

FIG. 4 shows process drawings for illustrating a method for producing one embodiment of the light emitting diode device of the present invention using the phosphor encapsulating sheet shown in FIG. 1, subsequent to FIG. 3:

FIG. 4 (e) illustrating a step of attaching the encapsulating layer to the board, FIG. 4 (f) illustrating a step of allowing the phosphor encapsulating sheet and the board to be subjected to a thermal compression bonding, and FIG. 4 (g) illustrating a step of performing dicing of the light emitting diode device.

DETAILED DESCRIPTION OF THE INVENTION

Figure 1:
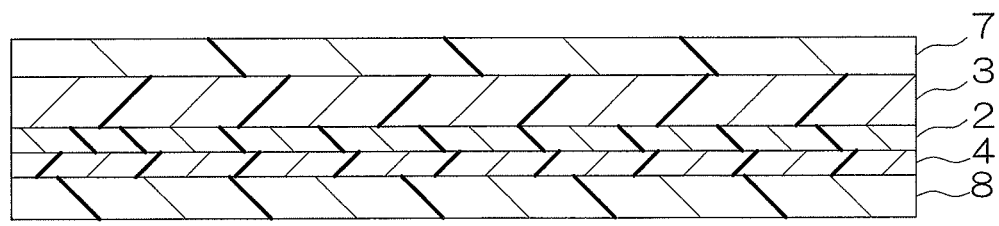
FIG. 1 shows a sectional view of one embodiment of a phosphor encapsulating sheet of the present invention.
Figure 2:
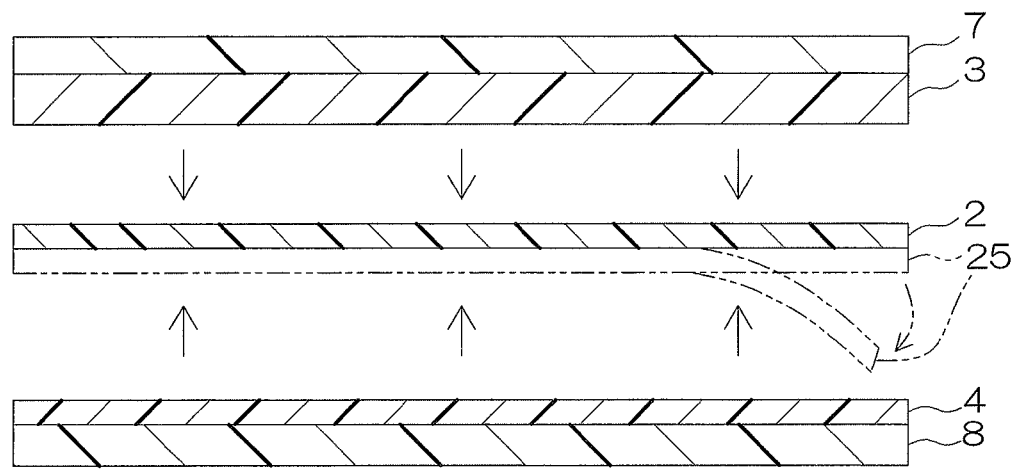
FIG. 2 shows a sectional view for illustrating a method for producing the phosphor encapsulating sheet shown in FIG. 1.

FIG. 1 shows a sectional view of one embodiment of a phosphor encapsulating sheet of the present invention. FIG. 2 shows a sectional view for illustrating a method for producing the phosphor encapsulating sheet shown in FIG. 1. FIGS. 3 and 4 show process drawings for illustrating a method for producing one embodiment of a light emitting diode device of the present invention using the phosphor encapsulating sheet shown in FIG. 1.

In FIG. 1, a phosphor encapsulating sheet 1 is an encapsulating sheet for encapsulating light emitting diode elements 5 (ref: FIG. 3 (d)). To be specific, the phosphor encapsulating sheet 1 includes a phosphor layer 2, an encapsulating layer 3 which is formed on (at one side in the thickness direction of) the phosphor layer 2, and an adhesive layer 4 which is formed below (at the other side in the thickness direction of) the phosphor layer 2.

The phosphor layer 2 is formed into a sheet shape or a plate shape. The phosphor layer 2 is, for example, formed from a phosphor composition which contains, as essential components, a phosphor and a resin or is, for example, formed from a ceramic of a phosphor as a phosphor ceramic plate. Preferably, the phosphor layer 2 is formed from a phosphor composition.

Examples of the phosphor include a yellow phosphor which is capable of converting blue light into yellow light, a red phosphor which is capable of converting blue light into red light, and a green phosphor which is capable of converting blue light into green light.

Examples of the yellow phosphor include a silicate type phosphor such as $(Sr, Ba)_2SiO_4$:Eu (barium orthosilicate (BOS)), an α-sialon type phosphor such as Ca-α-SiAlON:Eu, and a garnet type phosphor such as $Y_3Al_5O_{12}$:Ce (YAG:Ce) and $Tb_3Al_3O_{12}$:Ce (TAG:Ce).

An example of the red phosphor includes a nitride phosphor such as $CaAlSiN_3$:Eu.

An example of the green phosphor includes a phosphide phosphor such as $LaPO_4$:Ce,Tb.

As the phosphor, preferably, a yellow phosphor is used, more preferably, a garnet type phosphor is used, or particularly preferably, YAG:Ce is used.

The phosphor is, for example, in the form of a particle. The average particle size (the average of the maximum length) of the phosphor obtained by measuring with a laser diffraction scattering particle size analyzer is, for example, 0.1 to 100 μm, or preferably 0.2 to 30 μm.

The mixing ratio of the phosphor with respect to 100 parts by mass of the resin is, for example, 1 to 50 parts by mass, or preferably 3 to 35 parts by mass.

An example of the resin includes a resin which transmits through light such as a silicone resin, an epoxy resin, a styrene resin, an acrylic resin, a polycarbonate resin, an urethane resin, and a polyolefin resin.

The resin can be used alone (one only) or can be used in combination of two or more.

Preferably, in view of transparency and durability, a silicone resin is used.

An example of the silicone resin includes a silicone resin composition such as a condensation reaction and addition reaction type silicone resin composition.

The condensation reaction and addition reaction type silicone resin composition is a silicone resin composition which can be subjected to a condensation reaction and an addition reaction (to be specific, a hydrosilylation reaction) by heating. To be more specific, the condensation reaction and addition reaction type silicone resin composition is a silicone resin composition which can be subjected to a condensation reaction to be brought into a B-stage state (a semi-cured state, hereinafter the same) by heating and then, be subjected to an addition reaction (to be specific, for example, a hydrosilylation reaction) to be brought into a C-stage state (a completely cured state, hereinafter the same) by further heating.

Examples of the condensation reaction and addition reaction type silicone resin composition include a first thermosetting silicone resin composition which contains a polysiloxane containing silanol groups at both ends, an alkenyl group-containing alkoxysilane, and an organohydrogensiloxane; a second thermosetting silicone resin composition which contains a polysiloxane containing silanol groups at both ends, a silicon compound containing an ethylenically unsaturated hydrocarbon group, an epoxy group-containing silicon compound, and an organohydrogensiloxane; a third thermosetting silicone resin composition which contains a first organopolysiloxane having, in one molecule, at least two alkenylsilyl groups, a second organopolysiloxane having, in one molecule, at least two hydrosilyl groups, a hydrosilylation catalyst, and a curing retarder; a fourth thermosetting silicone resin composition which contains a first organopolysiloxane having, in one molecule, both at least two ethylenically unsaturated hydrocarbon groups and at least two hydrosilyl groups, a second organopolysiloxane having, in one molecule, at least two hydrosilyl groups without containing an ethylenically unsaturated hydrocarbon group, a hydrosilylation catalyst, and a hydrosilylation retarder; and a fifth thermosetting silicone resin composition which contains a first organopolysiloxane having, in one molecule, both at least two ethylenically unsaturated hydrocarbon groups and at least two silanol groups, a second organopolysiloxane having, in one molecule, at least two hydrosilyl groups without containing an ethylenically unsaturated hydrocarbon group, and a hydrosilylation catalyst.

These condensation reaction and addition reaction type silicone resin compositions can be used alone or in combination of two or more.

As the condensation reaction and addition reaction type silicone resin composition, preferably, a second thermosetting silicone resin composition is used.

In the second thermosetting silicone resin composition, of the polysiloxane containing silanol groups at both ends, the silicon compound containing an ethylenically unsaturated hydrocarbon group (hereinafter, defined as an ethylenic silicon compound), the epoxy group-containing silicon compound, and the organohydrogensiloxane, the polysiloxane containing silanol groups at both ends, the ethylenic silicon compound, and the epoxy group-containing silicon compound are condensation materials (materials subjected to a condensation reaction), and the ethylenic silicon compound and the organohydrogensiloxane are addition materials (materials subjected to an addition reaction).

The polysiloxane containing silanol groups at both ends is an organosiloxane which contains silanol groups (SiOH groups) at both ends of a molecule and to be specific, is represented by the following general formula (1).

General Formula (1):

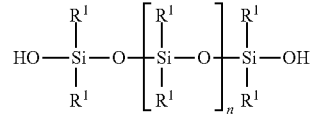

(where, in general formula (1), $R^1$ represents a monovalent hydrocarbon group selected from a saturated hydrocarbon group and an aromatic hydrocarbon group. "n" represents an integer of 1 or more.)

In the above-described general formula (1), in the monovalent hydrocarbon group represented by $R^1$, examples of the saturated hydrocarbon group include a straight chain or branched chain alkyl group having 1 to 6 carbon atoms (such as a methyl group, an ethyl group, a propyl group, an isopropyl group, a butyl group, an isobutyl group, a pentyl group, and a hexyl group) and a cycloalkyl group having 3 to 6 carbon atoms (such as a cyclopentyl group and a cyclohexyl group).

In the above-described general formula (1), in the monovalent hydrocarbon group represented by $R^1$, an example of the aromatic hydrocarbon group includes an aryl group having 6 to 10 carbon atoms (such as a phenyl group and a naphthyl group).

In the above-described general formula (1), $R^1$s may be the same or different from each other. Preferably, $R^1$s are the same.

As the monovalent hydrocarbon group, preferably, an alkyl group having 1 to 6 carbon atoms and an aryl group having 6 to 10 carbon atoms are used, or more preferably, in view of transparency, thermal stability, and light resistance, a methyl group is used.

In the above-described general formula (1), "n" is preferably, in view of stability and/or handling ability, an integer of 1 to 10,000, or more preferably an integer of 1 to 1,000.

"n" in the above-described general formula (1) is calculated as an average value.

To be specific, examples of the polysiloxane containing silanol groups at both ends include a polydimethylsiloxane containing silanol groups at both ends, a polymethylphenylsiloxane containing silanol groups at both ends, and a polydiphenylsiloxane containing silanol groups at both ends.

These polysiloxanes containing silanol groups at both ends can be used alone or in combination.

Of the polysiloxanes containing silanol groups at both ends, preferably, a polydimethylsiloxane containing silanol groups at both ends is used.

The number average molecular weight of the polysiloxane containing silanol groups at both ends is, for example, in view of stability and/or handling ability, 100 to 1,000,000, or preferably 200 to 100,000. The number average molecular weight is calculated by conversion based on standard polystyrene with a gel permeation chromatography. The number average molecular weight of a material, other than the polysiloxane containing silanol groups at both ends, to be described later, is also calculated in the same manner as the description above.

The silanol group equivalent in the polysiloxane containing silanol groups at both ends is, for example, 0.002 to 25 mmol/g, or preferably 0.02 to 25 mmol/g.

The mixing ratio of the polysiloxane containing silanol groups at both ends with respect to 100 parts by mass of the condensation material is, for example, 1 to 99.99 parts by mass, preferably 50 to 99.9 parts by mass, or more preferably 80 to 99.5 parts by mass.

The ethylenic silicon compound is a silane compound having both an ethylenically unsaturated hydrocarbon group and a leaving group in a silanol condensation reaction and to be specific, is represented by the following general formula (2).

General Formula (2):

(where, in general formula (2), $R^2$ represents a monovalent ethylenically unsaturated hydrocarbon group. $X^1$ represents a halogen atom, an alkoxy group, a phenoxy group, or an acetoxy group. $X^1$s may be the same or different from each other.)

In the above-described general formula (2), examples of the ethylenically unsaturated hydrocarbon group represented by $R^2$ include a substituted or unsubstituted ethylenically unsaturated hydrocarbon group. Examples thereof include an alkenyl group and a cycloalkenyl group.

An example of the alkenyl group includes an alkenyl group having 2 to 10 carbon atoms such as a vinyl group, an allyl group, a propenyl group, a butenyl group, a pentenyl group, a hexenyl group, a heptenyl group, and an octenyl group.

An example of the cycloalkenyl group includes a cycloalkenyl group having 3 to 10 carbon atoms such as a cyclohexenyl group and a norbornenyl group.

As the ethylenically unsaturated hydrocarbon group, in view of reactivity with a hydrosilyl group, preferably, an alkenyl group is used, more preferably, an alkenyl group having 2 to 5 carbon atoms is used, or particularly preferably, a vinyl group is used.

$X^1$ in the above-described general formula (2) is a leaving group in the silanol condensation reaction. $SiX^1$ group in the above-described general formula (2) is a reactive functional group in the silanol condensation reaction.

In the above-described general formula (2), examples of the halogen atom represented by $X^1$ include bromine, chlorine, fluorine, and iodine.

In the above-described general formula (2), examples of the alkoxy group represented by $X^1$ include an alkoxy group containing a straight chain or branched chain alkyl group having 1 to 6 carbon atoms (such as a methoxy group, an ethoxy group, a propoxy group, an isopropoxy group, a butoxy group, an isobutoxy group, a pentyloxy group, and a hexyloxy group) and an alkoxy group containing a cycloalkyl group having 3 to 6 carbon atoms (such as a cyclopentyloxy group and a cyclohexyloxy group).

In the above-described general formula (2), $X^1$s may be the same or different from each other. Preferably, $X^1$s are the same.

Of the $X^1$s in the above-described general formula (2), preferably, an alkoxy group is used, or more preferably, a methoxy group is used.

Examples of the ethylenic silicon compound include a trialkoxysilane containing an ethylenically unsaturated hydrocarbon group, a trihalogenated silane containing an ethylenically unsaturated hydrocarbon group, a triphenoxysilane containing an ethylenically unsaturated hydrocarbon group, and a triacetoxysilane containing an ethylenically unsaturated hydrocarbon group.

These ethylenic silicon compounds can be used alone or in combination.

Of the ethylenic silicon compounds, preferably, a trialkoxysilane containing an ethylenically unsaturated hydrocarbon group is used.

To be specific, examples of the trialkoxysilane containing an ethylenically unsaturated hydrocarbon group include a vinyltrialkoxysilane such as a vinyltrimethoxysilane, a vinyltriethoxysilane, and a vinyltripropoxysilane; an allyltrimethoxysilane; a propenyltrimethoxysilane; a butenyltrimethoxysilane; and a cyclohexenyltrimethoxysilane.

Of the trialkoxysilanes containing an ethylenically unsaturated hydrocarbon group, preferably, a vinyltrialkoxysilane is used, or more preferably, a vinyltrimethoxysilane is used.

The mixing ratio of the ethylenic silicon compound with respect to 100 parts by mass of the condensation material is, for example, 0.01 to 90 parts by mass, preferably 0.01 to 50 parts by mass, or more preferably 0.01 to 10 parts by mass.

The epoxy group-containing silicon compound is a silane compound having both an epoxy group and a leaving group in a silanol condensation reaction and to be specific, is represented by the following general formula (3)

General Formula (3):

(where, in general formula (3), $R^3$ represents a group having an epoxy structure. $X^2$ represents a halogen atom, an alkoxy group, a phenoxy group, or an acetoxy group. $X^2$s may be the same or different from each other.)

In the above-described general formula (3), examples of the group having an epoxy structure represented by $R^3$ include an epoxy group, a glycidyl ether group, and an epoxycycloalkyl group such as an epoxycyclohexyl group.

Of the groups having an epoxy structure, preferably, a glycidyl ether group is used. To be specific, the glycidyl ether group is a glycidoxyalkyl group represented by the following general formula (4).

General Formula (4):

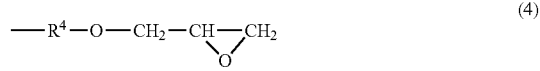

(where, in general formula (4), $R^4$ represents a divalent hydrocarbon group selected from a saturated hydrocarbon group and an aromatic hydrocarbon group.)

In the above-described general formula (4), in the divalent hydrocarbon group represented by $R^4$, examples of the saturated hydrocarbon group include an alkylene group having 1 to 6 carbon atoms (such as a methylene group, an ethylene group, a propylene group, and a butylene group) and a cycloalkylene group having 3 to 8 carbon atoms (such as a cyclopentylene group and a cyclohexylene group).

In the above-described general formula (4), in the divalent hydrocarbon group represented by $R^4$, an example of the aromatic hydrocarbon group includes an arylene group having 6 to 10 carbon atoms (such as a phenylene group and a naphthylene group).

As the divalent hydrocarbon group, preferably, an alkylene group having 1 to 6 carbon atoms is used, or more preferably, a propylene group is used.

To be specific, examples of the glycidyl ether group include a glycidoxymethyl group, a glycidoxyethyl group, a glycidoxypropyl group, a glycidoxycyclohexyl group, and a glycidoxyphenyl group.

Of the glycidyl ether groups, preferably, a glycidoxypropyl group is used.

$X^2$ in the above-described general formula (3) is a leaving group in the silanol condensation reaction. $SiX^2$ group in the above-described general formula (3) is a reactive functional group in the silanol condensation reaction.

In the above-described general formula (3), an example of the halogen atom represented by $X^2$ includes the same halogen atom as that represented by $X^1$ in the above-described general formula (2).

In the above-described general formula (3), an example of the alkoxy group represented by $X^2$ includes the same alkoxy group as that represented by $X^1$ in the above-described general formula (2).

In the above-described general formula (3), $X^2$s may be the same or different from each other. Preferably, $X^2$s are the same.

As $X^2$ in the above-described general formula (3), preferably, an alkoxy group is used, or more preferably, a methoxy group is used.

Examples of the epoxy group-containing silicon compound include an epoxy group-containing trialkoxysilane, an epoxy group-containing trihalogenated silane, an epoxy group-containing triphenoxysilane, and an epoxy group-containing triacetoxysilane.

These epoxy group-containing silicon compounds can be used alone or in combination.

Of the epoxy group-containing silicon compounds, preferably, an epoxy group-containing trialkoxysilane is used.

To be specific, examples of the epoxy group-containing trialkoxysilane include a glycidoxyalkyltrimethoxysilane such as a glycidoxymethyltrimethoxysilane, a (2-glycidoxyethyl)trimethoxysilane, and a (3-glycidoxypropyl)trimethoxysilane; a (3-glycidoxypropyl)triethoxysilane; a (3-glycidoxypropyl)tripropoxysilane; and a (3-glycidoxypropyl)triisopropoxysilane.

Of the epoxy group-containing trialkoxysilanes, preferably, a glycidoxyalkyltrialkoxysilane is used, or more preferably, a (3-glycidoxypropyl)trimethoxysilane is used.

The mixing ratio of the epoxy group-containing silicon compound with respect to 100 parts by mass of the condensation material is, for example, 0.01 to 90 parts by mass, preferably 0.01 to 50 parts by mass, or more preferably 0.01 to 1 parts by mass.

The molar ratio ($SiOH/(SiX^1+SiX^2)$) of the silanol group (the SiOH group) in the polysiloxane containing silanol groups at both ends to the reactive functional group (the $SiX^1$ group and the $SiX^2$ group) in the ethylenic silicon compound and the epoxy group-containing silicon compound is, for example, 20/1 to 0.2/1, preferably 10/1 to 0.5/1, or more preferably substantially 1/1.

The molar ratio of the ethylenic silicon compound to the epoxy group-containing silicon compound is, for example, 10/90 to 99/1, preferably 50/50 to 97/3, or more preferably 80/20 to 95/5.

When the molar ratio is within the above-described range, there is an advantage that the adhesive properties of a cured material can be improved, while the strength thereof is ensured.

The organohydrogensiloxane is an organosiloxane having, in one molecule, at least two hydrosilyl groups without containing an ethylenically unsaturated hydrocarbon group.

To be specific, examples of the organohydrogensiloxane include an organopolysiloxane containing a hydrogen atom in its side chain and an organopolysiloxane containing hydrogen atoms at both ends.

The organopolysiloxane containing a hydrogen atom in its side chain is an organohydrogensiloxane having a hydrogen atom as a side chain that branches off from the main chain. Examples thereof include a methylhydrogenpolysiloxane, a dimethylpolysiloxane-co-methylhydrogenpolysiloxane, an ethylhydrogenpolysiloxane, and a methylhydrogenpolysiloxane-co-methylphenylpolysiloxane.

The number average molecular weight of the organopolysiloxane containing a hydrogen atom in its side chain is, for example, 100 to 1,000,000.

The organopolysiloxane containing hydrogen atoms at both ends is an organohydrogensiloxane having hydrogen atoms at both ends of the main chain. Examples thereof include a polydimethylsiloxane containing hydrosilyl groups at both ends, a polymethylphenylsiloxane containing hydrosilyl groups at both ends, and a polydiphenylsiloxane containing hydrosilyl groups at both ends.

The number average molecular weight of the organopolysiloxane containing hydrogen atoms at both ends is, for example, in view of stability and/or handling ability, 100 to 1,000,000, or preferably 100 to 100,000.

These organohydrogensiloxanes can be used alone or in combination.

Of the organohydrogensiloxanes, preferably, an organopolysiloxane containing a hydrogen atom in its side chain is used, or more preferably, a dimethylpolysiloxane-co-methylhydrogenpolysiloxane is used.

The mixing ratio of the organohydrogensiloxane with respect to 100 parts by mass of the ethylenic silicon compound is, though depending on the molar ratio of the ethylenically unsaturated hydrocarbon group ($R^2$ in the above-described general formula (2)) in the ethylenic silicon compound to the hydrosilyl group (the SiH group) in the organohydrogensiloxane, for example, 10 to 10,000 parts by mass, or preferably 100 to 1,000 parts by mass.

The molar ratio ($R^2/SiH$) of the ethylenically unsaturated hydrocarbon group ($R^2$ in the above-described general formula (2)) in the ethylenic silicon compound to the hydrosilyl group (the SiH group) in the organohydrogensiloxane is, for example, 20/1 to 0.05/1, preferably 20/1 to 0.1/1, more preferably 10/1 to 0.1/1, particularly preferably 10/1 to 0.2/1, or most preferably 5/1 to 0.2/1. The molar ratio thereof can be also set to be, for example, less than 1/1 and not less than 0.05/1.

The above-described polysiloxane containing silanol groups at both ends, ethylenic silicon compound, epoxy group-containing silicon compound, and organohydrogensiloxane are blended with a catalyst to be stirred and mixed, so that the second thermosetting silicone resin composition is prepared.

Examples of the catalyst include a condensation catalyst and an addition catalyst (a hydrosilylation catalyst).

The condensation catalyst is not particularly limited as long as it is a substance capable of improving the reaction rate of a condensation reaction, that is, a silanol condensation reaction of the silanol group with the reactive functional group (the $SiX^1$ group in the above-described general formula (2) and the $SiX^2$ group in the above-described general formula (3)). Examples of the condensation catalyst include an acid such as hydrochloric acid, acetic acid, formic acid, and sulfuric acid; a base such as potassium hydroxide, sodium hydroxide, potassium carbonate, and tetramethylammonium hydroxide; and a metal such as aluminum, titanium, zinc, and tin.

These condensation catalysts can be used alone or in combination.

Of the condensation catalysts, in view of compatibility and thermal decomposition properties, preferably, a base is used, or more preferably, tetramethylammonium hydroxide is used.

The mixing ratio of the condensation catalyst with respect to 100 mol of the polysiloxane containing silanol groups at both ends is, for example, 0.1 to 50 mol, or preferably 0.5 to 5 mol.

The addition catalyst is not particularly limited as long as it is a substance capable of improving the reaction rate of an addition reaction, that is, a hydrosilylation reaction of the ethylenically unsaturated hydrocarbon group with the SiH group. An example thereof includes a metal catalyst such as a platinum catalyst including platinum black, platinum chloride, chloroplatinic acid, a platinum olefin complex, a platinum carbonyl complex, and platinum acetyl acetate; a palladium catalyst; and a rhodium catalyst.

These addition catalysts can be used alone or in combination.

Of the addition catalysts, in view of compatibility, transparency, and catalyst activity, preferably, a platinum catalyst is used, or more preferably, a platinum carbonyl complex is used.

The mixing ratio of the addition catalyst, as a number of parts by mass of the metal amount in the addition catalyst, with respect to 100 parts by mass of the organohydrogensiloxane is, for example $1.0 \times 10^{-4}$ to 1.0 parts by mass, preferably $1.0 \times 10^{-4}$ to 0.5 parts by mass, or more preferably $1.0 \times 10^{-4}$ to 0.05 parts by mass.

As the above-described catalyst, a catalyst in a solid state can be used as it is. Alternatively, in view of handling ability, a catalyst can be also used as a solution or as a dispersion liquid dissolved or dispersed in a solvent.

An example of the solvent includes an organic solvent such as an alcohol including methanol and ethanol; a silicon compound including siloxane; an aliphatic hydrocarbon including hexane; an aromatic hydrocarbon including toluene; and ether including tetrahydrofuran. Also, an example of the solvent includes an aqueous solvent such as water.

As the solvent, when the catalyst is a condensation catalyst, preferably, an alcohol is used and when the catalyst is an addition catalyst, preferably, a silicon compound and an aromatic hydrocarbon are used.

In order to prepare the second thermosetting silicone resin composition, for example, the above-described materials (the condensation materials and the addition materials) and the catalysts can be blended simultaneously. Alternatively, each of the materials and each of the catalysts can be added, respectively, at different timings. Furthermore, a part of the components can be added simultaneously and each of the remaining components can be added, respectively, at different timings.

Of the preparing methods of the second thermosetting silicone resin composition, preferably, the following method is used. First, the condensation materials and the condensation catalyst are added simultaneously. Next, the addition material is added thereto and thereafter, the addition catalyst is added thereto.

To be specific, the polysiloxane containing silanol groups at both ends, the ethylenic silicon compound, and the epoxy group-containing silicon compound (that is, the condensation materials) are simultaneously blended with the condensation catalyst at the above-described proportion to be stirred for, for example, 5 minutes to 24 hours.

At the time of blending and stirring, the temperature can be also adjusted to be, for example, 0 to 60° C. so as to improve the compatibility and the handling ability of the condensation materials.

At the time of blending of the materials and the condensation catalyst, a compatibilizing agent for improving the compatibility thereof can be added at an appropriate proportion.

An example of the compatibilizing agent includes an organic solvent such as an alcohol including methanol. When the condensation catalyst is prepared as a solution or a dispersion liquid of the organic solvent, the organic solvent can serve as the compatibilizing agent.

Thereafter, the pressure in the system (the above-described mixture) is reduced as required, so that a volatile component (the organic solvent) is removed.

Next, the organohydrogensiloxane is blended into the obtained mixture of the condensation materials and the condensation catalyst to be stirred for, for example, 1 to 120 minutes.

At the time of blending and stirring, the temperature can be also adjusted to be, for example, 0 to 60° C. so as to improve the compatibility and the handling ability of the mixture and the organohydrogensiloxane.

Thereafter, the addition catalyst is blended into the system (the above-described mixture) to be stirred for, for example, 1 to 60 minutes.

In this way, the second thermosetting silicone resin composition can be prepared.

The resin contains a silicone resin at a content ratio of, for example, 70 mass % or more, preferably 90 mass % or more, or more preferably 100 mass % (that is, the silicone resin only).

These resins can be used alone or in combination of two or more.

The mixing ratio of the resin with respect to a phosphor composition is, for example, 50 to 99 mass %, preferably 60 to 95 mass %, or more preferably 70 to 90 mass %.

The phosphor composition contains, as an optional component, for example, a filler excluding the above-described phosphor.

An example of the filler includes inorganic microparticles such as oxide microparticles including silica (silicon dioxide) microparticles, titanium oxide microparticles, zinc oxide microparticles, magnesium oxide microparticles, zirconium oxide microparticles, and iron oxide microparticles; sulfate compound microparticles including barium sulfate microparticles; carbonate compound microparticles including calcium carbonate microparticles and barium carbonate microparticles; complex oxide microparticles (excluding the above-described oxide microparticles) including barium titanate microparticles; and hydroxide microparticles including aluminum hydroxide microparticles. Also, an example of the filler includes organic microparticles such as silicone microparticles.

As the filler, preferably, silica microparticles and silicone microparticles are used, or more preferably, silica microparticles are used.

Examples of the silica microparticles include fused silica microparticles and crystalline silica microparticles. Preferably, fused silica microparticles (that is, silica glass microparticles) are used.

The silicone microparticles are microparticles of the polysiloxane (after curing) having a cross-linking structure. An example thereof includes polysilsesquioxane microparticles.

The shape of the filler is not limited and examples of the shape thereof include a sphere shape, a plate shape, and a needle shape. The average value of the maximum length (in the case of a sphere shape, the average particle size) of the filler is, for example, 1 to 50,000 nm, preferably 1 to 5,000 nm, more preferably 1 to 1,000 nm, or even more preferably 5 to 500 nm. The average value of the maximum length is measured using a laser diffraction scattering particle size analyzer.

These fillers can be used alone or in combination of two or more.

In the phosphor composition, when the filler is blended, the total number of parts by mass of the phosphor and the filler with respect to 100 parts by mass of the resin is, for example, 1 to 50 parts by mass, or preferably 3 to 30 parts by mass. In addition, the mass ratio (the phosphor mass/(the phosphor mass+the filler mass) of the phosphor to the total number of parts by mass of the phosphor and the filler is, for example, 0.0001 to 1, or preferably 0.01 to 1.

The mass ratio (the phosphor mass/the filler mass) of the phosphor to the filler is, for example, 0.2 to 3.0, or preferably 0.5 to 2.0.

In order to prepare the phosphor composition, the resin, the phosphor, and, if necessary, the filler are blended to be uniformly mixed.

In this way, the phosphor and the filler are uniformly dispersed and mixed in the resin.

In the preparation of the phosphor composition, a known solvent can be blended at an appropriate proportion as required.

In this way, the phosphor composition is prepared.

In order to form the phosphor layer 2, as referred in FIG. 2, the prepared phosphor composition is applied onto the upper surface of a release sheet 25 (a phantom line) and is dried by heating.

The heating temperature in the drying is, for example, 80 to 160° C., or preferably 90 to 150° C. The heating duration is, for example, 5 to 60 minutes, or preferably 5 to 30 minutes.

When the resin contains a silicone resin, the silicone resin is brought into a B-stage state by the above-described heating.

Thereafter, the silicone resin in a B-stage state is brought into a C-stage state by further heating. The heating temperature for bringing the silicone resin into a C-stage state, is, for example, 100 to 200° C. and the heating duration is, for example, 30 minutes to 2 hours.

On the other hand, when the phosphor layer 2 is formed as a phosphor ceramic plate, the phosphor, which is a ceramic material, is sintered. That is, the phosphor layer 2 is obtained as a phosphor ceramic plate by sintering the phosphor.

That is, the phosphor layer 2 is prepared as a silicone resin in a B-stage state, a silicone resin in a C-stage state, or a phosphor ceramic plate.

The phosphor layer 2 can be provided as a single layer or as a laminate of a plurality of layers. When the phosphor layer 2 is provided as a laminate of a plurality of layers, a yellow phosphor layer containing a yellow phosphor, a red phosphor layer containing a red phosphor, a green phosphor layer containing a green phosphor, and the like are laminated.

The thickness of the phosphor layer 2 is, for example, 30 to 1,000 μm, or preferably 50 to 700 μm.

The encapsulating layer 3 is, as shown in FIG. 1, formed on the entire upper surface of the phosphor layer 2.

The encapsulating layer 3 is, for example, formed from an encapsulating composition which contains, as an essential component, an encapsulating resin.

An example of the encapsulating resin includes the same resin as that contained in the above-described phosphor composition. Preferably, a silicone resin is used.

As the encapsulating resin, of the silicone resins, the same type or different types of silicone resins can be used. As the encapsulating resin, preferably, the same type of silicone resin as that illustrated in the resin of the phosphor layer 2 is used.

The encapsulating resin contains a silicone resin at a content ratio of, for example, 70 mass % or more, preferably 90 mass % or more, or more preferably 100 mass % (that is, the silicone resin only).

These encapsulating resins can be used alone or in combination of two or more.

The mixing ratio of the encapsulating resin with respect to the encapsulating composition is, for example, 50 mass % or more, or preferably 60 mass % or more, and is, for example, 99 mass % or less, or preferably 97 mass % or less.

The encapsulating composition contains, as an optional component, for example, the same filler as that described above.

The mixing ratio of the filler with respect to 100 parts by mass of the encapsulating resin is, for example, 1 to 50 parts by mass, or preferably 3 to 35 parts by mass.

In order to prepare the encapsulating composition, the encapsulating resin and, if necessary, the filler are blended to be uniformly mixed.

In this way, the filler is uniformly dispersed and mixed in the encapsulating resin.

In the preparation of the encapsulating composition, a known solvent can be blended at an appropriate proportion as required.

In this way, the encapsulating composition is prepared.

In order to form the encapsulating layer 3, as shown in FIG. 2, the prepared encapsulating composition is applied onto one surface in the thickness direction (the lower surface in FIG. 2) of a first substrate 7 and is dried by heating.

The first substrate 7 is formed of, for example, a resin plate made of a polyester resin such as polyethylene terephthalate (PET) and polyethylene naphthalate and an olefin resin such as polyethylene and, for example, a metal foil made of stainless steel. The thickness of the first substrate 7 is, for example, 25 to 100 μm, or preferably 30 to 70 μm.

The heating conditions in the drying are the same as those in the drying of the phosphor layer 2. Preferably, the heating duration is 5 to 15 minutes.

When the encapsulating resin contains a silicone resin, the silicone resin is brought into a B-stage state by the above-described heating.

In this way, the encapsulating layer 3 which is laminated on the lower surface of the first substrate 7 is obtained.

The thickness of the obtained encapsulating layer 3 is, for example, 50 to 600 μm, or preferably 100 to 500 μm.

The adhesive layer 4 is, as shown in FIG. 1, formed on the entire lower surface of the phosphor layer 2 and is provided so as to allow the phosphor layer 2 to adhere to a cover layer 14 (described later, ref: FIG. 3 (b)).

The adhesive layer 4 is, for example, formed from an adhesive composition which contains, as an essential component, an adhesive.

An example of the adhesive includes the same resin as that contained in the above-described phosphor composition. Preferably, a silicone resin is used.

As the adhesive, of the silicone resins, the same type or different types of silicone resins can be used. As the adhesive, preferably, the same type of silicone resin as that illustrated in the resin of the phosphor layer 2 is used.

The adhesive contains a silicone resin at a content ratio of, for example, 70 mass % or more, preferably 90 mass % or more, or more preferably 100 mass % (that is, the silicone resin only).

These adhesives can be used alone or in combination of two or more.

The mixing ratio of the adhesive with respect to the adhesive composition is, for example, 50 mass % or more, or preferably 60 mass % or more, and is, for example, 99 mass % or less, or preferably 97 mass % or less.

The adhesive composition contains, as an optional component, for example, the same filler as that described above. In this way, the adhesive layer 4 can be allowed to function as a diffusion layer. The mixing ratio of the filler with respect to 100 parts by mass of the adhesive is, for example, 1 to 50 parts by mass, or preferably 3 to 35 parts by mass.

In order to prepare the adhesive composition, the adhesive and, if necessary, the filler are blended to be uniformly mixed.

In this way, the filler is uniformly dispersed and mixed in the adhesive.

In the preparation of the adhesive composition, a known solvent can be blended at an appropriate proportion as required.

In this way, the adhesive composition is prepared.

In order to form the adhesive layer 4, as shown in FIG. 2, the prepared adhesive composition is applied onto one surface in the thickness direction (the upper surface in FIG. 2) of a second substrate 8 and is dried by heating.

An example of the material of the second substrate 8 includes the same material as that of the first substrate 7.

The heating conditions in the drying are the same as those in the drying of the phosphor layer 2.

When the adhesive contains a silicone resin, the silicone resin is brought into a B-stage state by the above-described heating.

In this way, the adhesive layer 4 which is laminated on the upper surface of the second substrate 8 is obtained.

The thickness of the obtained adhesive layer 4 is, for example, 10 to 200 μm, or preferably 20 to 100 μm.

In order to fabricate the phosphor encapsulating sheet 1, for example, first, the phosphor layer 2 which is laminated on the upper surface of the release sheet 25, the encapsulating layer 3 which is laminated on the lower surface of the first substrate 7, and the adhesive layer 4 which is laminated on the upper surface of the second substrate 8 are prepared, respectively, The storage shear modulus G' of the prepared phosphor layer 2 at 25° C. with a thickness of 50 μm is, for example, $1.0 \times 10^3$ to $2.0 \times 10^6$ Pa, or preferably $2.0 \times 10^3$ to $1.0 \times 10^5$ Pa.

To be more specific, when the phosphor layer 2 is formed from a phosphor composition containing a silicone resin in a B-stage state so as to have a thickness of 50 μm, the storage shear modulus G' of the phosphor layer 2 at 25° C. is, for example, $2.0 \times 10^4$ to $4.0 \times 10^5$ Pa, or preferably $4.0 \times 10^4$ to $2.0 \times 10^5$ Pa.

Next, as referred in FIG. 4 (e), when the phosphor encapsulating sheet 1 is used in a light emitting diode device 20 to be described later, the phosphor layer 2 which is to be formed into a flat plate shape along the plane direction is described.

To be specific, in order to form the phosphor layer 2 which has the above-described storage shear modulus G' and is formed from a phosphor composition containing a silicone resin in a B-stage state, the heating conditions in the drying of the phosphor composition after being applied to the release sheet 25 and/or the type and the mixing proportion of the phosphor and the filler are selected. To be more specific, preferably, the heating duration of the phosphor composition is adjusted to be 10 to 15 minutes.

When the phosphor layer 2 is formed from a phosphor composition containing a silicone resin in a C-stage state so as to have a thickness of 50 μm, the storage shear modulus G' of the phosphor layer 2 at 25° C. is, for example, $5.0 \times 10^5$ to $2.0 \times 10^6$ Pa, or preferably $6.0 \times 10^5$ to $1.0 \times 10^6$ Pa.

Furthermore, when the phosphor layer 2 is formed from a phosphor ceramic plate so as to have a thickness of 50 μm, the storage shear modulus G' of the phosphor layer 2 at 25° C. is, for example, $1 \times 10^{11}$ to $5 \times 10^{11}$ Pa, or preferably $2 \times 10^{11}$ to $4 \times 10^{11}$ Pa.

The storage shear modulus G' of the phosphor layer 2 at 25° C. is calculated by a dynamic viscoelasticity measurement at a frequency of 1 Hz and a measurement temperature of 25° C. The storage shear modulus G' of the encapsulating layer 3 and the adhesive layer 4 to be described next is also calculated by the same method as that described above.

The storage shear modulus G' of the prepared encapsulating layer 3 with a thickness of 140 μm at 25° C. is, for example, set so as to satisfy the following formula (A) and is, preferably, set so as to satisfy the following formula (A').

(The storage shear modulus G' of the phosphor layer 2)/(The storage shear modulus G' of the encapsulating layer 3)≥20    (A)

20<(The storage shear modulus G' of the phosphor layer 2)/(The storage shear modulus G' of the encapsulating layer 3)<30    (A')

Figure 5:
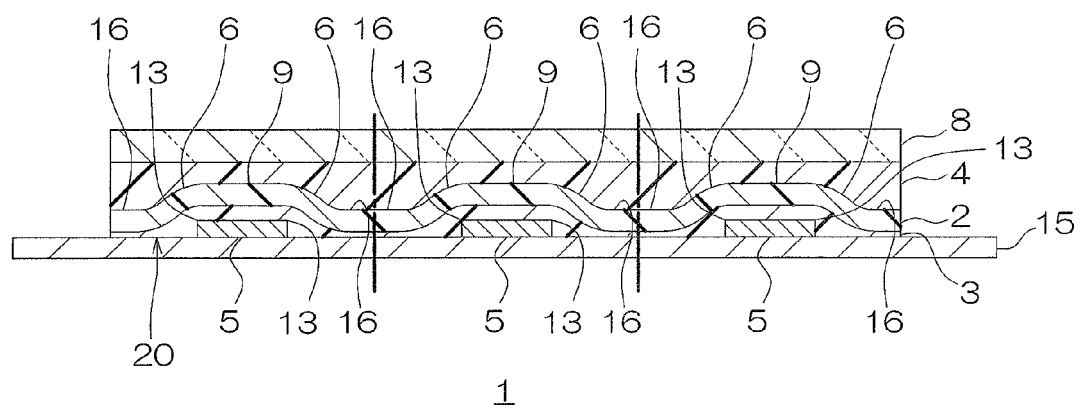
FIG. 5 shows a sectional view of another embodiment (an embodiment in which the phosphor layer corresponds to the shape of the light emitting diode element) of the light emitting diode device of the present invention.

When the proportion (the storage shear modulus G' of the phosphor layer 2/the storage shear modulus G' of the encapsulating layer 3) of the storage shear modulus G' of the phosphor layer 2 to the storage shear modulus G' of the encapsulating layer 3 is below the above-described lower limit, the phosphor layer 2 may be deformed (ref: FIG. 5). On the other hand, when the above-described proportion exceeds the above-described upper limit, a crack may occur in the phosphor layer 2.

To be specific, the storage shear modulus G' of the encapsulating layer 3 with a thickness of 140 μm at 25° C. is, for example, $1.0 \times 10^3$ to $2.0 \times 10^4$ Pa, or preferably $2.0 \times 10^3$ to $1.0 \times 10^4$ Pa.

Preferably, the encapsulating layer 3 is formed from an encapsulating composition containing a silicone resin in a B-stage state.

That is, in order to form the encapsulating layer 3 which has the above-described storage shear modulus G' and is formed from an encapsulating composition containing a silicone resin in a B-stage state, the heating conditions in the drying of the encapsulating composition after being applied to the first substrate 7 and/or the type and the mixing proportion of the filler are selected.

Preferably, the prepared adhesive layer 4 is formed from an adhesive composition containing a silicone resin in a B-stage state and the storage shear modulus G' thereof at 25° C. is, for example, $1.0 \times 10^3$ to $2.0 \times 10^4$ Pa.

Thereafter, as shown in FIG. 2, the encapsulating layer 3 and the adhesive layer 4 are laminated on the phosphor layer 2 from above and below, respectively. To be specific, as shown by down arrows in FIG. 2, the encapsulating layer 3 is attached (transferred) to the upper surface of the phosphor layer 2. As shown by a phantom arrow in FIG. 2, the release sheet 25 is peeled from the lower surface of the phosphor layer 2 and subsequently, as shown by up arrows in FIG. 2, the adhesive layer 4 is attached (transferred) to the lower surface of the phosphor layer 2.

In this way, the phosphor encapsulating sheet 1 is obtained.

Thereafter, the phosphor encapsulating sheet 1 is heated and dried as required. The heating temperature is, for example, 40 to 140° C., or preferably 100 to 140° C. The heating duration is, for example, 0.5 to 15 minutes, or preferably 1 to 10 minutes.

Next, a method for producing the light emitting diode device 20 using the phosphor encapsulating sheet 1 is described with reference to FIGS. 3 and 4.

First, in this method, as shown by the arrows in FIG. 3 (*a*), the second substrate 8 is peeled from the lower surface of the adhesive layer 4.

Subsequently, in this method, as shown in FIG. 3 (*b*), the cover layer 14 is attached to the lower surface of the adhesive layer 4 (a first attaching step).

An example of the cover layer 14 includes a plate formed of a material which is transparent and tough such as a glass and an acrylic resin. Preferably, a glass plate is used. To be specific, examples of the cover layer 14 include a diffusion plate and a lens.

The size of the cover layer 14 is set to be laminated on the entire lower surface of the adhesive layer 4. The thickness of the cover layer 14 is, for example, 30 to 1,500 μm, or preferably 50 to 1,000 μm.

Next, in this method, as shown by the arrows in FIG. 3 (*c*), the first substrate 7 is peeled from the upper surface of the encapsulating layer 3.

Next, in this method, as shown in FIG. 3 (*d*), a board 15 on which the light emitting diode elements 5 are mounted is prepared and subsequently, the board 15, the phosphor encapsulating sheet 1, and the cover layer 14 are set in a pressing machine.

The board 15 is formed into a generally flat plate shape. To be specific, the board 15 is formed of a laminated board in which a conductive layer, as a circuit pattern, is laminated below an insulating board. The insulating board is formed of, for example, a silicon board, a ceramic board, a polyimide resin board, or the like. Preferably, the insulating board is formed of a ceramic board, to be specific, a sapphire ($Al_2O_3$) board. The conductive layer is formed of, for example, a conductor such as gold, copper, silver, or nickel. The thickness of the board 15 is, for example, 30 to 1,500 μm, or preferably 500 to 1,000 μm.

A plurality of the light emitting diode elements 5 are provided at spaced intervals to each other on the lower surface (one surface in the thickness direction) of the board 15 in the plane direction (a direction perpendicular to the thickness direction). Each of the light emitting diode elements 5 is formed into a generally rectangular shape in plane view and into a generally rectangular shape in sectional view expanding in the plane direction. Each of the light emitting diode elements 5 is flip-chip-mounting connected or wire-bonding connected to the conductive layer in the board 15. Each of the light emitting diode elements 5 is an element which emits blue light.

The thickness of each of the light emitting diode elements 5 is, for example, 50 to 300 μm, or preferably 100 to 200 μm. The maximum length in the plane direction of each of the light emitting diode elements 5 is, for example, 500 to 2,000 μm, or preferably 1,000 to 1,500 μm. The gap between the light emitting diode elements 5 is, for example, 50 to 2,000 μm, or preferably 500 to 1,000 μm.

The pressing machine is made up so as to be capable of pressing the board 15, the phosphor encapsulating sheet 1, and the cover layer 14 in the thickness direction. To be specific, the pressing machine is provided with a lower board 10 and an upper board 11 which is disposed at spaced intervals to the upper side of the lower board 10.

The upper board 11 is provided so as to be capable of performing relative movement with respect to the lower board 10 in the thickness direction. To be specific, the upper board 11 and the lower board 10 are provided so as to be capable of pressing with respect to the phosphor encapsulating sheet 1 and the board 15. Also, the upper board 11 and the lower board 10 are formed to be larger than the phosphor encapsulating sheet 1 so as to include the phosphor encapsulating sheet 1 when projected in the thickness direction.

A material which forms the lower board 10 and the upper board 11 is appropriately selected and an example of the material includes a hard material such as a glass and a glass-epoxy resin.

In order to set the board 15 in the pressing machine, the upper surface (the opposite surface to the surface on which the light emitting diode elements 5 are mounted) of the board 15 is temporarily fixed to the upper board 11 via a thermal release sheet which is not shown.

The thermal release sheet is a release sheet which temporarily fixes the board 15 to the upper board 11 and is peeled from the board 15 by the subsequent heating. A commercially available product can be used as the thermal release sheet. To be specific, a REVALPHA series (a registered trademark, manufactured by NITTO DENKO CORPORATION) or the like can be used.

In order to set the phosphor encapsulating sheet 1 and the cover layer 14 in the pressing machine, the lower surface of the cover layer 14 is disposed on the upper surface of the lower board 10.

In this way, the light emitting diode elements 5 are spaced in opposed relation to the phosphor encapsulating sheet 1 so as to be included therein when projected in the thickness direction.

Additionally, a spacer 12 is provided so as to surround the phosphor encapsulating sheet 1 at a portion around the phosphor encapsulating sheet 1 on the upper surface of the lower board 10.

The spacer 12 is formed so as to surround the phosphor encapsulating sheet 1 in the plane view and is formed into a generally rectangular shape in sectional view extending in the thickness direction. The thickness (the length in the thickness direction) of the spacer 12 is set so that the pushed-in amount in which the thickness of the phosphor encapsulating sheet 1 before a thermal compression bonding (a second attaching step) to be described later is pushed in the thickness direction by the thermal compression bonding is within a desired range. To be specific, the thickness of the spacer 12 is set to be the same as that of the sum total of the thickness of the phosphor encapsulating sheet 1, the cover layer 14, and the board 15 (ref: FIG. 4 (*e*)) after the thermal compression bonding.

Next, in this method, as shown by the arrows in FIG. 3 (*d*), and in FIG. 4 (*e*), the encapsulating layer 3 is attached to the board 15 so as to cover the light emitting diode elements 5 (the second attaching step).

To be specific, the upper board 11 is pushed down toward the lower board 10, and the board 15 and the phosphor encapsulating sheet 1 are subjected to a thermal compression bonding. The pushing down of the upper board 11 is performed until the lower surface of the circumference end portion of the upper board 11 comes into contact with the upper surface of the spacer 12. The pressure of the pushing down is, for example, 0.05 to 0.5 MPa, or preferably 0.1 to 0.3 MPa.

Along with the pushing down of the upper board 11, the board 15, the phosphor encapsulating sheet 1, and the cover layer 14 are heated. The heating temperature is, for example, 100 to 200° C., or preferably 120 to 180° C. The heating duration is, for example, 1 to 60 minutes, or preferably 2 to 30 minutes.

When the phosphor layer 2 is formed from a phosphor composition containing a silicone resin in a B-stage state, by the above-described thermal compression bonding, the silicone resin is brought into a C-stage state and the phosphor layer 2 is completely cured.

When the storage shear modulus G' of the phosphor layer 2 and the encapsulating layer 3 satisfies the above-described formula (A) (preferably, the above-described formula (A')), the shape in sectional view of the phosphor layer 2 does not substantially change over before and after the thermal compression bonding and to be specific, is formed into a flat plate shape along the plane direction.

When the encapsulating layer 3 is formed from an encapsulating composition containing a silicone resin in a B-stage state, by the above-described thermal compression bonding, the silicone resin is brought into a C-stage state and the encapsulating layer 3 is completely cured. In this way, the light emitting diode elements 5 are embedded in the encapsulating layer 3 to be encapsulated.

Furthermore, when the adhesive layer 4 is formed from an adhesive composition containing a silicone resin in a B-stage state, by the above-described thermal compression bonding, the silicone resin is brought into a C-stage state and the phosphor layer 2 is completely cured. In this way, the cover layer 14 is adhered to the phosphor layer 2 via the adhesive layer 4.

Therefore, in a case where the phosphor layer 2 is formed from a phosphor composition containing a silicone resin in a B-stage state; a case where the encapsulating layer 3 is formed from an encapsulating composition containing a silicone resin in a B-stage state; and a case where the adhesive layer 4 is formed from an adhesive composition containing a silicone resin in a B-stage state, by the above-described thermal compression bonding, each of the silicone resins contained in the phosphor layer 2, the encapsulating layer 3, and the adhesive layer 4 is simultaneously brought into a C-stage state and the phosphor layer 2, the encapsulating layer 3, and the adhesive layer 4 are completely cured at the same time.

On the other hand, in a case where the encapsulating layer 3 is formed from an encapsulating composition containing a silicone resin in a B-stage state and the adhesive layer 4 is formed from an adhesive composition containing a silicone resin in a B-stage state, while the phosphor layer 2 is formed from a phosphor composition containing a silicone resin in a C-stage state or a phosphor ceramic plate, by the above-described thermal compression bonding, each of the silicone resins contained in the encapsulating layer 3 and the adhesive layer 4 is simultaneously brought into a C-stage state and the encapsulating layer 3 and the adhesive layer 4 are completely cured at the same time.

In this way, as shown in FIG. 4 (e), the light emitting diode device 20 in which a plurality of the light emitting diode elements 5 are encapsulated by the encapsulating layer 3 and the cover layer 14 is adhered to the phosphor layer 2 via the adhesive layer 4 is obtained as a package.

Thereafter, as shown in FIG. 4 (f), the light emitting diode device 20 is taken out from the pressing machine and is reversed upside down. Subsequently, as shown by dash-dot lines in FIG. 4 (f), the light emitting diode device 20 is subjected to a cutting (dicing) process. That is, the light emitting diode device 20 is subjected to a dicing process along the thickness direction, so that the light emitting diode elements 5 are cut into a plurality of pieces. That is, as shown in FIG. 4 (g), the light emitting diode elements 5 are individualized (singulated).

According to the phosphor encapsulating sheet 1, the phosphor layer 2 is adhered to the cover layer 14 via the adhesive layer 4 and the light emitting diode elements 5 can be encapsulated by the encapsulating layer 3.

Additionally, in the phosphor encapsulating sheet 1, the encapsulating layer 3 and the adhesive layer 4 are provided on both surfaces in the thickness direction of the phosphor layer 2 in advance. Therefore, according to the method for producing the light emitting diode device 20, the phosphor layer 2 is attached to the cover layer 14 via the adhesive layer 4 and the encapsulating layer 3 is attached to the board 15 so as to cover the light emitting diode elements 5, so that the light emitting diode elements 5 can be easily encapsulated by the encapsulating layer 3, while the phosphor layer 2 is adhered to the cover layer 14 by the adhesive layer 4.

That is, the adhesive layer 4, the phosphor layer 2, and the encapsulating layer 3 are sequentially laminated on the cover layer 14 or the encapsulating layer 3, the phosphor layer 2, and the adhesive layer 4 are sequentially laminated on the board 15, so that the steps of heating each of the layers each time are omitted and therefore, the production steps can be simplified and the production cost can be reduced.

To be more specific, in a case where the phosphor layer 2 is formed from a phosphor composition containing a silicone resin in a B-stage state; a case where the encapsulating layer 3 is formed from an encapsulating composition containing a silicone resin in a B-stage state; and a case where the adhesive layer 4 is formed from an adhesive composition containing a silicone resin in a B-stage state, by the thermal compression bonding in the second attaching step, each of the silicone resins contained in the phosphor layer 2, the encapsulating layer 3, and the adhesive layer 4 can be brought into a C-stage state at one time (collectively) and therefore, the phosphor layer 2, the encapsulating layer 3, and the adhesive layer 4 can be completely cured at one time.

Also, in a case where the encapsulating layer 3 is formed from an encapsulating composition containing a silicone resin in a B-stage state and the adhesive layer 4 is formed from an adhesive composition containing a silicone resin in a B-stage state, while the phosphor layer 2 is formed from a phosphor composition containing a silicone resin in a C-stage state or a phosphor ceramic plate, by the above-described thermal compression bonding, each of the silicone resins contained in the encapsulating layer 3 and the adhesive layer 4 can be brought into a C-stage state at one time (collectively) and therefore, the encapsulating layer 3 and the adhesive layer 4 can be completely cured at one time.

As a result, the production steps can be simplified.

Therefore, the light emitting diode device 20 in which the light emitting diode elements 5 are encapsulated by the phosphor encapsulating sheet 1 can emit high-energy light by improving the reliability by the encapsulating layer 3 and converting light emitted from the light emitting diode elements 5 by the phosphor layer 2, and furthermore, can emit the light via the cover layer 14.

In addition, in the light emitting diode device 20, the phosphor layer 2 is formed into a flat plate shape along the plane direction, so that it is possible to uniform the thickness of the phosphor layer 2 along the plane direction, that is, the uniformity of the thickness of the phosphor layer 2 can be ensured.

In the embodiments in FIGS. 3 and 4, as shown in FIG. 3 (b), first, the first attaching step in which the cover layer 14 is attached to the phosphor layer 2 via the adhesive layer 4 is performed and thereafter, as shown in FIG. 4 (e), the second attaching step in which the encapsulating layer 3 is attached to the board 15 is performed. However, the order of performing the first attaching step and the second attaching step is not particularly limited and the order may be reversed.

That is, for example, it is also possible that first, the second attaching step is performed and thereafter, the first attaching step is performed. In such a case, in the first attaching step, the heating (to be specific, the thermal compression bonding) is performed, while in the second attaching step, the encapsulating layer 3 is simply compressively bonded to the board 15 without heating. The heating temperature in the first attaching step is the same as that in the above-described second attaching step.

Furthermore, the first attaching step and the second attaching step can be performed at the same time.

Even when the order of performing the first attaching step and the second attaching step is appropriately changed in this way, the same function and effect as that in the embodiments in FIGS. 3 and 4 can be achieved.

FIG. 5 shows a sectional view of another embodiment (an embodiment in which the phosphor layer corresponds to the shape of the light emitting diode element) of the light emitting diode device of the present invention.

In FIG. 5, the same reference numerals are provided for members corresponding to each of those described above and their detailed description is omitted.

As shown in FIG. 5, the phosphor layer 2 can be also formed corresponding to the shapes of the light emitting diode elements 5.

That is, the phosphor layer 2 is formed so as to be along the plane direction and to detour around the light emitting diode elements 5.

To be specific, in the phosphor layer 2, curved portions 6 which cover corner portions 13 (ridge portions on the upper surface and the side surfaces) of each of the light emitting diode elements 5 via the encapsulating layer 3 are formed.

In the phosphor layer 2, each of the curved portions 6 connects a first flat portion 9 which is formed into a flat plate shape at the immediate upper portion of the upper surface of each of the light emitting diode elements 5 to a second flat portion 16 which is formed into a flat plate shape at the immediate upper portion of the upper surface of the board 15 between the light emitting diode elements 5. Each of the curved portions 6 is formed to be inclined (hang) in a curved shape from the first flat portion 9 toward the second flat portion 16, that is, toward the outer side of the light emitting diode elements 5.

In order to obtain the light emitting diode elements 5 provided with the phosphor layer 2 in the above-described shape, the storage shear modulus G' of the phosphor layer 2 (a thickness of 50 μm) and the encapsulating layer 3 (a thickness of 140 μm) for forming the phosphor encapsulating sheet 1, which are shown in FIG. 2, at 25° C. is set, for example, to satisfy the following formula (B), preferably, to satisfy the following formula (B'), or more preferably, to satisfy the following formula (B").

(The storage shear modulus $G'$ of the phosphor layer 2)/(The storage shear modulus $G'$ of the encapsulating layer 3)<20    (B)

1≤(The storage shear modulus $G'$ of the phosphor layer 2)/(The storage shear modulus $G'$ of the encapsulating layer 3)≤15    (B')

5≤(The storage shear modulus $G'$ of the phosphor layer 2)/(The storage shear modulus $G'$ of the encapsulating layer 3)≤15    (B")

To be specific, the storage shear modulus G' of the phosphor layer 2 formed on the upper surface of the release sheet 25 and having a thickness of 50 μm, which is shown in FIG. 2, at 25° C. is, for example, $1.0\times10^3$ to $8.0\times10^4$ Pa, preferably $1.5\times10^3$ to $7.75\times10^4$ Pa, or more preferably $2.0\times10^3$ to $6.0\times10^4$ Pa.

Preferably, the phosphor layer 2 having the above-described storage shear modulus G' is formed from a phosphor composition containing a silicone resin in a B-stage state and the heating conditions in the drying of the phosphor composition after being applied and/or the type and the mixing proportion of the phosphor and the filler are selected.

To be more specific, the heating temperature of the phosphor composition is preferably adjusted to be 5 minutes or more and below 10 minutes.

The storage shear modulus G' of the encapsulating layer 3 formed on the lower surface of the first substrate 7 and having a thickness of 140 μm, which is shown in FIG. 2, at 25° C. is, for example, $1.0\times10^3$ to $2.0\times10^4$ Pa, or preferably $2.0\times10^3$ to $1.0\times10^4$ Pa.

Preferably, the encapsulating layer 3 having the above-described storage shear modulus G' is formed from an encapsulating composition containing a silicone resin in a B-stage state and the heating conditions in the drying of the encapsulating composition after being applied to the first substrate 7 and/or the type and the mixing proportion of the filler are selected.

Thereafter, as shown by the arrows in FIG. 2, the encapsulating layer 3 is attached (transferred) to the upper surface of the phosphor layer 2. Also, as shown by the phantom arrow in FIG. 2, the release sheet 25 is peeled from the lower surface of the phosphor layer 2 and subsequently, the adhesive layer 4 is attached (transferred) to the lower surface of the phosphor layer 2.

In this way, the phosphor encapsulating sheet 1 is obtained.

Thereafter, the phosphor encapsulating sheet 1 is heated as required. The heating temperature is, for example, 40 to 140° C., or preferably 100 to 140° C. and the heating duration is, for example, 0.5 to 15 minutes, or preferably 1 to 10 minutes.

Thereafter, the light emitting diode device 20 is obtained in conformity with the above-described steps in FIGS. 3 (a) to 4 (f).

In the second attaching step shown by the arrows in FIG. 3 (d), and in FIG. 4 (e), that is, in the step of attaching the encapsulating layer 3 to the board 15 so as to cover the light emitting diode elements 5, when the storage shear modulus G' of the phosphor layer 2 and the encapsulating layer 3 satisfies the above-described formula (B) (preferably, the above-described formula (B')), the shape in sectional view of the phosphor layer 2 changes over before and after the thermal compression bonding and to be specific, as shown in FIG. 5, is formed into a shape in which the curved portions 6, the first flat portions 9, and the second flat portions 16 are formed.

The light emitting diode elements 5 are embedded in the encapsulating layer 3 and the shape in sectional view of the upper portion of the encapsulating layer 3 is formed into the above-described shape corresponding to the phosphor layer 2.

In addition, the cover layer 14 is adhered to the phosphor layer 2 via the adhesive layer 4 and the shape in sectional view of the lower portion of the adhesive layer 4 is formed into the above-described shape corresponding to the phosphor layer 2.

When the phosphor layer 2 has the above-described shape, the light angle dependence of the light emitting diode device 20 can be suppressed. Also, a leakage of light emitted from the light emitting diode elements 5 laterally (in the plane direction) can be prevented by the curved portions 6 and the second flat portions 16. To be specific, a leakage of blue light which is emitted to transmit through the encapsulating layer 3 and not to transmit through the phosphor layer 2 can be effectively prevented.

In the embodiment in FIG. 2, first, the phosphor layer 2, the encapsulating layer 3, and the adhesive layer 4 are prepared, respectively. Next, as shown by the arrows in FIG. 2, by a transfer method in which the encapsulating layer 3 is transferred to the upper surface of the phosphor layer 2 and the adhesive layer 4 is transferred to the lower surface of the phosphor layer 2, the phosphor encapsulating sheet 1 is produced. Alternatively, for example, though not shown, another method (a first direct coating method) can be used. In this method, for example, an encapsulating composition is directly applied to the upper surface of the phosphor layer 2 to be subsequently dried by heating, so that the encapsulating layer 3 is formed and for example, an adhesive composition is directly applied to the lower surface of the phosphor layer 2 to be subsequently dried by heating, so that the adhesive layer 4 is formed.

Alternatively, another method (a second direct coating method) can be also used. In this method, an encapsulating composition is applied to the lower surface of the first substrate 7 to be subsequently dried by heating, so that the encapsulating layer 3 is formed; next, a phosphor composition is directly applied to the lower surface of the encapsulating layer 3 to be subsequently dried by heating, so that the phosphor layer 2 is formed; and thereafter, an adhesive composition is directly applied to the lower surface of the phosphor layer 2 to be subsequently dried by heating, so that the adhesive layer 4 is formed. Thereafter, the second substrate 8 is laminated on the lower surface of the adhesive layer 4 as required.

In addition, in another method (a third direct coating method), the above-described production order can be reversed, that is, the adhesive layer 4 is formed from an adhesive composition on the upper surface of the second substrate 8; next, a phosphor composition is directly applied to the upper surface of the adhesive layer 4 to be subsequently dried by heating, so that the phosphor layer 2 is formed; and thereafter, an encapsulating composition is directly applied to the upper surface of the phosphor layer 2 to be subsequently dried by heating, so that the encapsulating layer 3 is formed. Thereafter, the first substrate 7 is laminated on the upper surface of the encapsulating layer 3 as required.

In the first to third direct coating methods, the storage shear modulus G' of the phosphor layer 2 and the encapsulating layer 3 satisfies at least the above-described formula (A) or the above-described formula (B).

EXAMPLES

While the present invention will be described hereinafter in further detail with reference to Prepared Examples and Examples, the present invention is not limited to these Prepared Examples and Examples.

Prepared Example 1

(Preparation of Silicone Resin)

15.76 g (0.106 mol) of a vinyltrimethoxysilane and 2.80 g (0.0118 mol) of a (3-glycidoxypropyl)trimethoxysilane were blended into 2031 g (0.177 mol) of a polysiloxane containing silanol groups at both ends (in general formula (1), all of $R^1$s are methyl, an average of "n" is 155, a number average molecular weight of 11,500, a silanol group equivalent of 0.174 mmol/g) which was heated at 40° C. and the obtained mixture was stirred and mixed.

The molar ratio (the number of moles of the silanol group/ the total number of moles of the methoxysilyl group) of the silanol group (SiOH) in the polydimethylsiloxane containing silanol groups at both ends to the methoxysilyl group ($SiOCH_3$) in the vinyltrimethoxysilane and the (3-glycidoxypropyl)trimethoxysilane was 1/1.

After the stirring and mixing, 0.97 mL (a catalyst content: 0.88 mmol, corresponding to 0.50 mol with respect to 100 mol of the polydimethylsiloxane containing silanol groups at both ends) of a methanol solution of tetramethylammonium hydroxide (a condensation catalyst, a concentration of 10 mass %) was added to the obtained mixture to be stirred at 40° C. for 1 hour. Thereafter, the obtained mixture (an oil) was stirred under a reduced pressure (10 mmHg) at 40° C. for 1 hour and a volatile component (methanol or the like) was removed.

Thereafter, the pressure in the system was brought back to the normal pressure and then, 44.5 g (0.022 mol) of an organohydrogensiloxane (manufactured by Shin-Etsu Chemical Co., Ltd., an average molecular weight of 2,000, a hydrosilyl group equivalent of 7.14 mmol/g) was added to the reacting product to be stirred at 40° C. for 1 hour.

The molar ratio ($CH_2$=CH—/SiH) of the vinyl group ($CH_2$=CH—) in the vinyltrimethoxysilane to the hydrosilyl group (the SiH group) in the organohydrogensiloxane was 1/3.

Thereafter, 0.13 mL (as a platinum, corresponding to 5.8× $10^{-3}$ parts by mass with respect to 100 parts by mass of the organohydrogensiloxane) of a siloxane solution of a platinum carbonyl complex (an addition catalyst, a platinum concentration of 2 mass %) was added to the system to be stirred at 40° C. for 10 minutes, so that a silicone resin was prepared.

Example 1

1. Fabrication of Phosphor Layer 5 parts by mass of a filler (AEROSIL 976S, silica microparticles, a sphere shape, an average particle size of 10 to 15 nm, manufactured by Nippon Aerosil Co., Ltd) and 10 parts by mass of a phosphor (YAG:Ce, a sphere shape, an average particle size of 17 μm) were blended into 100 parts by mass of the silicone resin in Prepared Example 1 to be stirred and mixed for 1 hour, so that a phosphor composition was prepared.

Thereafter, the phosphor composition was applied to the upper surface of a release sheet to be dried by heating at 135° C. for 10 minutes, so that a phosphor layer having a thickness of 50 μm was fabricated (ref: FIG. 2).

The silicone resin in the phosphor layer was in a B-stage state.

2. Fabrication of Encapsulating Layer 5 parts by mass of a filler (AEROSIL 976S, silica microparticles, a sphere shape, an average particle size of 10 to 15 nm, manufactured by Nippon Aerosil Co., Ltd) was blended into 100 parts by mass of the silicone resin in Prepared Example 1 to be stirred and mixed for 1 hour, so that an adhesive composition was prepared.

Thereafter, the adhesive composition was applied to the lower surface of a first substrate (made of PET) to be dried by heating at 135° C. for 6 minutes, so that an encapsulating layer having a thickness of 140 μm was fabricated (ref: FIG. 2).

The silicone resin in the encapsulating layer was in a B-stage state.

3. Fabrication of Adhesive Layer 5 parts by mass of a filler (AEROSIL 976S, silica microparticles, a sphere shape, an average particle size of 10 to 15 nm, manufactured by Nippon Aerosil Co., Ltd) was blended into 100 parts by mass of the silicone resin in Prepared Example 1 to be stirred and mixed for 1 hour, so that an adhesive composition was prepared (ref: FIG. 2).

Thereafter, the adhesive composition was applied to the upper surface of a second substrate (made of PET) to be dried by heating at 135° C. for 6 minutes, so that an adhesive layer having a thickness of 40 μm was fabricated (ref: FIG. 2).

The silicone resin in the adhesive layer was in a B-stage state.

4. Fabrication of Phosphor Encapsulating Sheet

The encapsulating layer was attached to the upper surface of the phosphor layer (ref: the down arrows in FIG. 2) and the release sheet was peeled from the lower surface of the phosphor layer (ref: the phantom arrow in FIG. 2). Subsequently, the adhesive layer was attached to the lower surface of the phosphor layer to be then dried by heating at 135° C. for 10 minutes, so that a phosphor encapsulating sheet having a thickness of 230 μm was fabricated (ref: FIG. 1).

5. Fabrication of Light Emitting Diode Device

The second substrate was peeled from the lower surface of the adhesive layer (ref: the arrows in FIG. 3 (a)) and next, a cover layer made of a glass plate and having a thickness of 150 μm was attached to the lower surface of the adhesive layer (a first attaching step, ref: FIG. 3 (b)).

Next, the first substrate was peeled from the upper surface of the encapsulating layer (ref: the arrows in FIG. 3 (c)).

Next, a board on which a plurality of light emitting diode elements were mounted and having a thickness of 100 μm and a size of 1,000 μm×1,000 μm was prepared, and the board, the phosphor encapsulating sheet, and the cover layer were set in a pressing machine (ref: FIG. 3 (d)).

A spacer having a thickness of 220 μm was provided at a portion of the lower board around the phosphor encapsulating sheet in the pressing machine so as to surround the phosphor encapsulating sheet and the cover layer.

The upper surface of the board was temporarily fixed to an upper board via a thermal release sheet (REVALPHA, manufactured by NITTO DENKO CORPORATION) which was not shown. The lower surface of the cover layer was disposed on the upper surface of the lower board.

Next, the encapsulating layer was attached to the board so as to cover the light emitting diode elements (ref: the arrows in FIG. 3 (d), and in FIG. 4 (e), a second attaching step).

To be specific, the upper board was pushed down toward the lower board and the board, the phosphor encapsulating sheet, and the cover layer were subjected to a thermal compression bonding at 0.22 MPa and 160° C. for 10 minutes.

In this way, the light emitting diode elements were embedded in the encapsulating layer. The cover layer was adhered to the phosphor layer via the adhesive layer. The phosphor layer was formed into a flat plate shape along the plane direction (ref: FIG. 4 (f)). The silicone resins in the phosphor layer, the encapsulating layer, and the adhesive layer were brought into a C-stage state.

In this way, a light emitting diode device was obtained.

Thereafter, the light emitting diode device was taken out from the pressing machine to be subjected to a dicing process, so that a light emitting diode device in which a plurality of the light emitting diode elements were cut into a plurality of pieces was obtained (ref: the dash-dot lines in FIG. 4 (f), and in FIG. 4 (g)).

Example 2

A phosphor encapsulating sheet was fabricated and subsequently, a light emitting diode device was obtained in the same manner as in Example 1, except that the heating duration in the drying of the phosphor composition was changed from 10 minutes to 5 minutes in 1. Fabrication of Phosphor Layer.

In the light emitting diode device, the phosphor layer was formed so as to connect a first flat portion to a second flat portion and to be inclined downwardly in a curved shape toward the outer side of the light emitting diode elements (ref: FIG. 5). The encapsulating layer and the adhesive layer were formed into a shape corresponding to the above-described shape of the phosphor layer.

Example 3

A phosphor encapsulating sheet was fabricated and subsequently, a light emitting diode device was obtained in the same manner as in Example 1, except that the heating duration in the drying of the phosphor composition was changed from 10 minutes to 15 minutes in 1. Fabrication of Phosphor Layer.

The phosphor layer was in a flat plate shape along the plane direction (ref: FIG. 4 (f)).

Example 4

A phosphor encapsulating sheet was fabricated and subsequently, a light emitting diode device was obtained in the same manner as in Example 1, except that the heating duration in the drying of the phosphor composition was changed from 10 minutes to 7 minutes in 1. Fabrication of Phosphor Layer.

In the light emitting diode device, the phosphor layer was formed so as to connect a first flat portion to a second flat portion and to be inclined downwardly in a curved shape toward the outer side of the light emitting diode elements (ref: FIG. 5). The encapsulating layer and the adhesive layer were formed into a shape corresponding to the above-described shape of the phosphor layer.

(Evaluation)

(Storage Shear Modulus G')

The storage shear modulus G' of the phosphor layer (ref: "1. Fabrication of Phosphor Layer"), the encapsulating layer (ref: "2. Fabrication of Encapsulating Layer"), and the adhesive layer (ref: "3. Fabrication of Adhesive Layer"), which were fabricated in Examples, at 25° C. was calculated by a dynamic viscoelasticity measurement using a rheometer.

The measurement conditions are described in the following.

Measurement Device: Rheometer (ARES, manufactured by Rheometric Scientific Inc.)

Measurement Temperature: 25° C.

Frequency: 1 Hz

The results are described in Table 1.

TABLE 1

|  | Ex. 1 | | Ex. 2 | | Ex. 3 | | Ex. 4 | |
| --- | --- | --- | --- | --- | --- | --- | --- | --- |
|  | G' (Pa) | Ratio (Times) | G' (Pa) | Ratio (Times) | G' (Pa) | Ratio (Times) | G' (Pa) | Ratio (Times) |
| Phosphor Layer | $1.32 \times 10^5$ | 25.8 | $5.58 \times 10^4$ | 10.9 | $1.53 \times 10^5$ | 30 | $7.65 \times 10^4$ | 15 |
| Encapsulating Layer Adhesive Layer | $5.10 \times 10^3$ | 1 | $5.10 \times 10^3$ | 1 | $5.10 \times 10^3$ | 1 | $5.10 \times 10^3$ | 1 |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A phosphor encapsulating sheet, for encapsulating a light emitting diode element, comprising, in order:

a first substrate, an encapsulating layer, a phosphor layer, and an adhesive layer, wherein the adhesive layer is a layer for being adhered to a cover layer, the encapsulating layer is in a B-stage and configured to be in direct contact with the light emitting diode element, and the first substrate is peelable from the encapsulating layer.

2. The phosphor encapsulating sheet according to claim 1, wherein the phosphor encapsulating sheet is obtained by laminating the phosphor layer and the encapsulating layer having a storage shear modulus G' at a frequency of 1 Hz at 25° C. satisfying the following formula (A):

(The storage shear modulus G' of the phosphor layer)/(The storage shear modulus G' of the encapsulating layer)≥20 (A).

3. The phosphor encapsulating sheet according to claim 1, wherein the phosphor encapsulating sheet is obtained by laminating the phosphor layer and the encapsulating layer having a storage shear modulus G' at a frequency of 1 Hz at 25° C. satisfying the following formula (B):

(The storage shear modulus G' of the phosphor layer)/(The storage shear modulus G' of the encapsulating layer)<20 (B).

4. The phosphor encapsulating sheet according to claim 1, wherein the encapsulating layer and the adhesive layer contain a silicone resin.

5. The phosphor encapsulating sheet according to claim 4, wherein the silicone resin is in a B-stage state.

6. The phosphor encapsulating sheet according to claim 1, wherein the phosphor layer is formed of at least one selected from the group consisting of a silicone resin in a B-stage state, a silicone resin in a C-stage state, and a ceramic plate.

* * * * *